US005805509A

United States Patent [19]
Leung et al.

[11] Patent Number: 5,805,509
[45] Date of Patent: Sep. 8, 1998

[54] METHOD AND STRUCTURE FOR GENERATING A BOOSTED WORD LINE VOLTAGE AND BACK BIAS VOLTAGE FOR A MEMORY ARRAY

[75] Inventors: Wingyu Leung, Cupertino; Jeffrey J. Lin, Danville, both of Calif.

[73] Assignee: Monolithic System Technology, Inc., Sunnyvale, Calif.

[21] Appl. No.: 891,124

[22] Filed: Jul. 10, 1997

Related U.S. Application Data

[62] Division of Ser. No. 610,108, Feb. 29, 1996, Pat. No. 5,703,827.

[51] Int. Cl.$^6$ ........................................................ H03K 3/01
[52] U.S. Cl. .................... 365/189.09; 365/230.06; 365/149; 327/534; 327/538; 327/540
[58] Field of Search .......................... 365/189.09, 189.11, 365/149, 230.06; 327/534, 535, 537, 538, 540

[56] References Cited

U.S. PATENT DOCUMENTS

| | | | |
|---|---|---|---|
| 4,585,954 | 4/1986 | Hashimoto | 307/296 |
| 5,267,201 | 11/1993 | Foss et al. | 365/189.09 |
| 5,329,168 | 7/1994 | Sugibayashi | 365/189.09 |
| 5,335,205 | 8/1994 | Ogihara | 365/189.09 |
| 5,359,552 | 10/1994 | Dhong et al. | 365/189.09 |
| 5,469,387 | 11/1995 | Kim | 365/189.09 |
| 5,521,871 | 5/1996 | Choi | 365/189.11 |
| 5,524,095 | 6/1996 | Someya et al. | 365/230.06 |

OTHER PUBLICATIONS

Horiguchi et al., "Dual–Operating–Voltage Scheme for a Single 5–V 16–Mbit DRAM", IEEE Journal of Solid–State Circuits, vol. 23, No. 5, Oct. 1988, pp. 1128–1132.

Fujii et al., "Session 16: Dynamic RAMs FAM 16.6: A 45ns 16Mb DRAM with Triple–Well Structure", ISSCC 89 / Friday, Feb. 17, 1989, pp. 248, 249 and 354.

Arimoto et al., "A 60ns 3.3V 16Mb DRAM", IEEE International Solid–State Circuits Conference, 1989, pp. 244 and 352.

Taylor et al., "A 1–Mbit CMOS Dynamic RAM with a Divided Bitline Matrix Architecture", IEEE Journal of Solid–State Circuits, vol. sc–20, No. 5, Oct. 1985, pp. 894–902.

Takeshima et al., "Session 16: Dynamic RAMs FAM 16.5: A 55ns 16Mb DRAM", ISSCC 89 / Friday, Feb. 17, 1989, pp. 246, 247 and 353.

Taniguchi et al., "Fully Boosted 64K Dynamic RAM with Automatic and Self–Refresh", IEEE Journal of Solid–State Circuits, vol. SC–16, No. 5, Oct. 1991, pp. 492–498.

*Primary Examiner*—Vu A. Le
*Attorney, Agent, or Firm*—Skjerven, Morrill, MacPherson, Franklin & Friel LLP; Norman R. Klivans

[57] ABSTRACT

A method and structure for generating a boosted word line voltage for a memory array, such as a DRAM array. To ensure that an adequate voltage is applied to the word line of the memory array during write operations, the word line driver circuit is connected to a boost voltage generator which provides a substantially constant, regulated voltage which is boosted to a level which is approximately equal to the $V_{cc}$ supply voltage plus the threshold voltage of the memory cell pass transistor. A bias voltage generator provides a negative voltage which is used to bias the substrate of the memory array. The boosted voltage generator and the bias voltage generator can be operated in response to the same clock signal used to operate the memory array. A latch-up prevention circuit is provided to ensure that the word line driver circuit does not latch-up during power-on before an adequate boost voltage has been established.

4 Claims, 3 Drawing Sheets

METHOD AND STRUCTURE FOR GENERATING A BOOSTED WORD LINE VOLTAGE AND BACK BIAS VOLTAGE FOR A MEMORY ARRAY

This application is a division of application Ser. No. 08/610,108, filed Feb. 29, 1996 U.S. Pat. No. 5,703,827.

BACKGROUND OF THE INVENTION

1. Field of the Invention

The present invention relates to a method and structure for generating a voltage for a semiconductor device. More specifically, the invention relates to the on-chip generation of voltages used to operate a memory array.

2. Description of the Prior Art

FIG. 1 is a schematic diagram of a memory cell 101 of a conventional dynamic random access memory (DRAM) array. Memory cell 101 includes a pass transistor 102 and a storage capacitor 103. Transistor 102 has a gate connected to word line 110, a source connected to storage capacitor 103 and a drain connected to bit line 111. During a write operation, word line driver circuit 120 applies a high voltage to word line 110, thereby turning on pass transistor 102. A ground supply voltage is applied to bit line 111 to store a logic low value in memory cell 101. Alternatively, a $V_{cc}$ supply voltage (e.g., 5 volts) is applied to bit line 111 to store a logic high value in memory cell 101.

The magnitude of the voltage applied to capacitor 103 when writing a logic high value into memory cell 101 directly affects the magnitude of the voltage provided on bit line 111 during a read operation. To ensure that a logic high value stored in memory cell 101 provides a voltage which can be sensed with sufficient margin on bit line 111 during a read operation, the voltage applied to word line 110 is boosted above the $V_{cc}$ supply voltage when writing a logic high value to memory cell 101. The boosted $V_{cc}$ supply voltage (hereinafter referred to as boosted word line voltage $V_{CCB}$) should exceed the $V_{cc}$ supply voltage by at least the threshold voltage ($V_T$) of pass transistor 102. By applying the boosted word line voltage $V_{CCB}$ to word line 110 when writing a logic high value to memory cell 101, the full $V_{cc}$ supply voltage is applied across capacitor 103 during this write operation.

An additional voltage which is typically provided to improve the operation of the DRAM array is the substrate bias supply voltage ($V_{BB}$). The substrate bias supply voltage $V_{BB}$ typically has a potential which is −1 to −2.5 volts more negative than the ground supply voltage. The substrate bias supply voltage $V_{BB}$ is applied to the bulk of transistor 102 (typically the substrate of the wafer on which the DRAM array is fabricated) to minimize the subthreshold leakage of pass transistor 102.

Circuitry is typically provided on the same chip as the DRAM array to generate both the boosted word line voltage $V_{CCB}$ and the substrate bias supply voltage $V_{BB}$. Such prior art has been documented in references such as: M. Horiguchi et al., IEEE JSSC, Vol. 23, No. 5, pp. 1128–1132; S. Fujii et al., Digest of ISSCC 1989, pp. 248–249; and Hashimoto et al., U.S. Pat. No. 4,585,954.

The word line boost voltage $V_{CCB}$ is generated on a demand basis. That is, the boost voltage $V_{CCB}$ is generated only when word line 110 is turned on. The boost voltage $V_{CCB}$ is subsequently discharged when the DRAM array is not being accessed.

In prior art schemes, word line driver circuit 120 is typically connected to a boost capacitor or a switched bootstrap capacitor circuit (not shown). For word line turn-on, word line 110 is initially charged to the $V_{cc}$ supply voltage minus the pass transistor threshold voltage $V_T$. The boost capacitor or switched bootstrap capacitor circuit is then activated to boost the voltage present on word line 110 to a boost voltage $V_{CCB}$ which is greater than the $V_{cc}$ supply voltage plus the pass transistor threshold voltage $V_T$. The boost voltage $V_{CCB}$ typically has a magnitude of about 1.5 to 1.7 times the $V_{cc}$ supply voltage. The boost voltage $V_{CCB}$ is not regulated, and typically varies by a factor of approximately two times the $V_{cc}$ supply voltage variation. In addition, the boost voltage $V_{CCB}$ varies inversely with the routing capacitance of word line 110. The relatively high magnitude of the boost voltage $V_{CCB}$ compensates for such variations. However, when word line 110 is turned on, coupling noise is introduced to bit line 111 as a result of gate-to-drain overlap capacitance of transistor 102. The higher the $V_{CCB}$ supply voltage, the larger the coupling noise. Increased coupling noise adversely effects the sensing margin of memory cell 101. It would therefore be desirable to minimize the word line boost voltage $V_{CCB}$ so that it does not far exceed the $V_{cc}$ supply voltage plus the threshold voltage $V_T$ of pass transistor 102.

In CMOS RAM, the coexistence of the substrate bias voltage $V_{BB}$ generator and the word line boost voltage $V_{CCB}$ generator on the same chip may cause latch up to occur during power-on conditions.

In addition, when the substrate bias voltage $V_{BB}$ generator and the boost voltage $V_{CCB}$ generators are provided on the same chip, one or more ring oscillators are used to drive the charge pump capacitors associated with each voltage generator. If an on-chip phase lock loop (PLL) circuit having a voltage controlled oscillator is used for synchronization with an external clock signal, frequency beating can exist between the ring oscillators and the PLL voltage controlled oscillator, thereby introducing clock signal jitter.

The output current capabilities of the charge pump circuits in the $V_{CCB}$ and $V_{BB}$ voltage generators are directly proportional to the oscillation frequencies of the ring oscillators. However, for a memory that has its internal operations synchronized with an external clock signal (e.g., synchronous DRAM), the demands on the output current capabilities of the charge pump circuits in the $V_{CCB}$ and $V_{BB}$ voltage generators are proportional to the frequency of the external clock signal. Since the frequency of each ring oscillator circuit is fixed by design, the charge pump circuits of the $V_{CCB}$ and $V_{BB}$ voltage generators must be designed to supply the maximum required output current at all times, regardless of the frequency of the external clock signal. Consequently, relatively large capacitors are required by these charge pump circuits, thereby undesirably increasing the layout area of the memory system.

It would therefore be desirable to have voltage generation circuits which would overcome the previously described deficiencies.

SUMMARY OF THE INVENTION

In accordance with the present invention, a boost voltage generation circuit is provided to generate a substantially constant, regulated word line boost voltage $V_{CCB}$. The boost voltage generation circuit is coupled to the word line driver circuits, which selectively apply the boost voltage $V_{CCB}$ to the word lines of the memory array. The boost voltage $V_{CCB}$ is selected such that the voltage applied to the word lines by the word line driver circuits is approximately is equal to the $V_{cc}$ supply voltage plus the threshold voltage $V_T$ of the pass transistors of the memory array.

In a particular embodiment, the boost voltage generation circuit includes a charge pump circuit and a voltage regulator circuit. The charge pump circuit generates an output voltage in response to a master clock signal. The voltage regulator enables the charge pump circuit when the output voltage is less than the desired boosted voltage and disables the charge pump circuit when the output voltage is greater than the desired boosted voltage. A latch-up prevention circuit connects the output terminal of the charge pump circuit to the $V_{cc}$ voltage supply during power-on, thereby preventing latch up.

A bias voltage generator can also be provided to generate a negative bias voltage $V_{BB}$ which is applied to the substrate on which the memory array is fabricated. The bias voltage generator operates in response to a clock signal generated by a ring oscillator circuit during power-on, such that the substrate is properly biased during power-on in the absence of the master clock signal. During normal operating conditions, the bias voltage generator is operated in response to the master clock signal.

The memory array can further include a clock synchronization circuit which generates the master clock signal in response to an external clock signal. The master clock signal is then used to control the boost voltage generator, the bias voltage generator and the memory array. Since all elements are operated from the same clock signal, frequency interference is minimized.

The present invention will be more fully understood in light of the following detailed description taken together with the drawings.

DETAILED DESCRIPTION OF THE INVENTION

Figure 1:
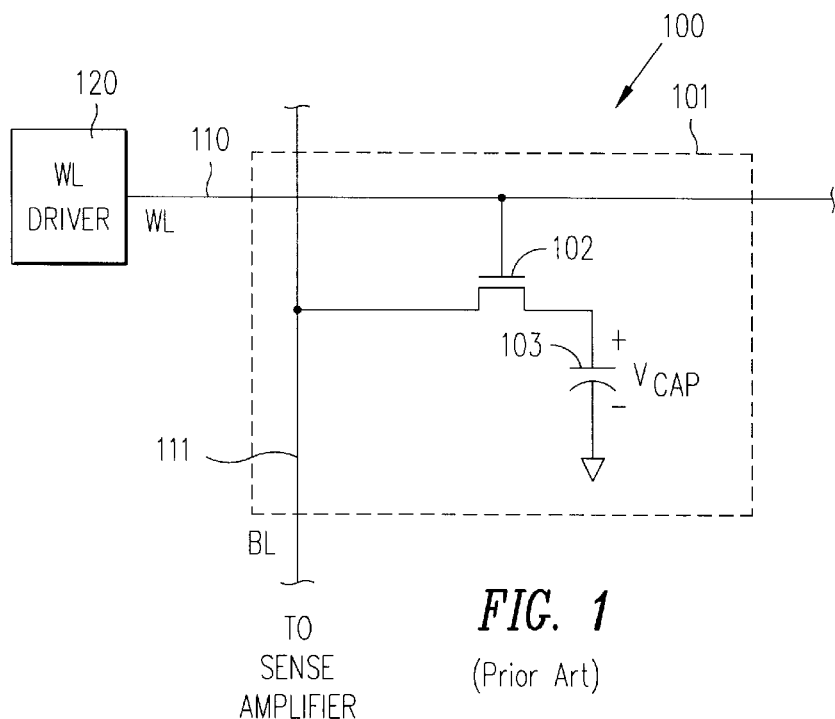
FIG. 1 is a schematic diagram of a conventional DRAM array.
Figure 2:
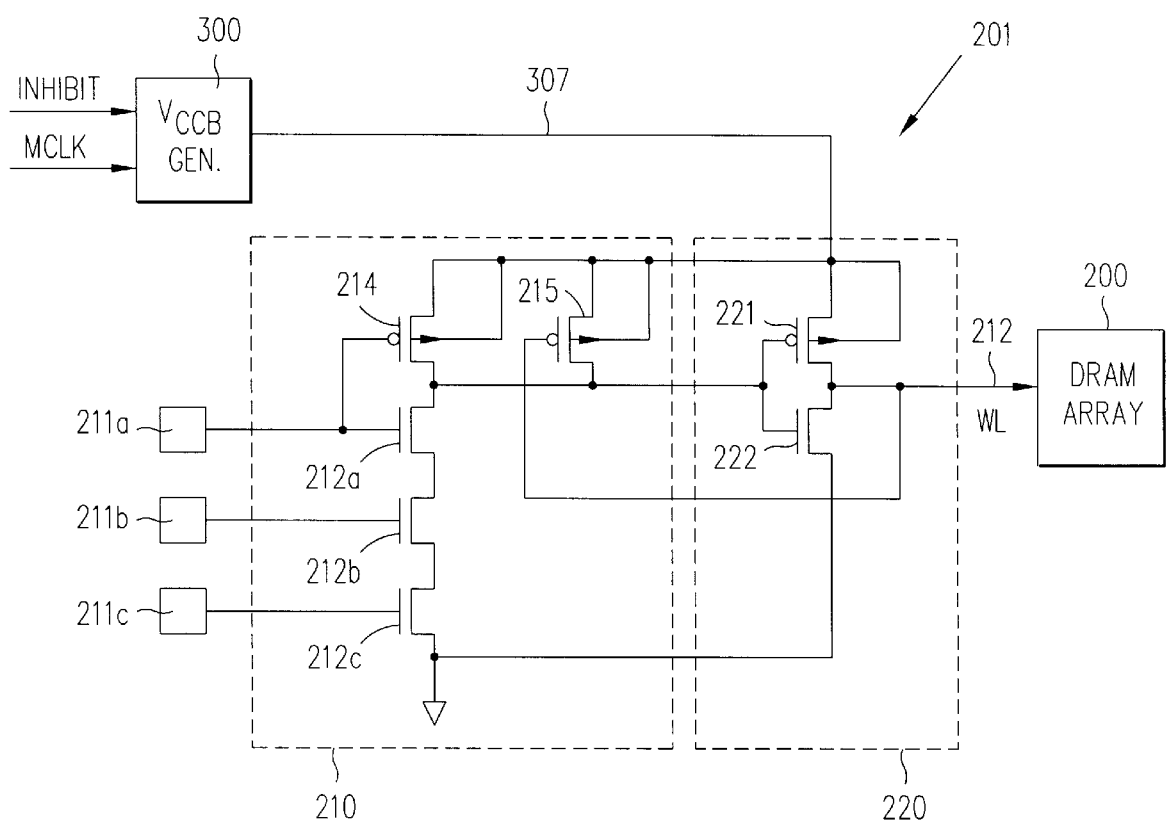
FIG. 2 is a schematic diagram of a word line decoder circuit and a word line driver circuit of a DRAM array in accordance with one embodiment of the invention.

FIG. 2 is a schematic diagram of a word line control circuit 201 in accordance with one embodiment of the invention. Word line control circuit 201 includes address decoder circuit 210 and word line driver circuit 220. Address decoder circuit 210 includes n-channel field effect transistors (FETs) 212a–212c, which are coupled to input terminals 211a–211c, respectively, and p-channel FETs 214–215. Word line driver circuit 220 includes p-channel FET 221 and n-channel FET 222. The source and the N-well of each of p-channel transistors 214, 215 and 221 are connected to word line boost voltage ($V_{CCB}$) generator circuit 300. The output of word line driver circuit 220 is connected to word line 212 of DRAM array 200.

In a particular embodiment, the memory system which includes DRAM array 200, word line control circuit 201 and $V_{CCB}$ voltage generator 300 is fabricated using a single or twin well process and a p-type monocrystalline silicon substrate. The bulk of each NMOS transistor of the memory system is connected to the substrate. The substrate is biased to a negative potential of approximately −1.5 volts by an on-chip substrate bias voltage $V_{BB}$ generator, as described in more detail in connection with FIG. 4. Each PMOS transistor of the memory system resides in an n-type well region (N-well). The bulk of each PMOS transistor is connected to the N-well on which the PMOS transistor resides.

The N-wells may be connected to different potentials. However, the parasitic bipolar transistor which is formed by the source (or drain) of a PMOS transistor, the N-well of the PMOS transistor, and the p-type substrate should not be turned on. To accomplish this, each N-well should assume a potential equal or higher than the source (or drain) of the residing PMOS transistor. If the potential of the source (or drain) exceeds the N-well potential, the parasitic bipolar transistor can turn on, possibly resulting in latch-up. Turning on the parasitic bipolar transistor for a prolonged time period may overload the substrate bias voltage generator due to the limited current sourcing capability (e.g, 2 mA) of the substrate bias voltage generator.

In word line control circuit 201, latch-up is of particular concern during power-on conditions, before the $V_{CCB}$ voltage generator 300 establishes a full $V_{CCB}$ output voltage. However, as described in more detail in connection with FIG. 4, during power-on conditions, the on-chip $V_{CCB}$ voltage generator 300 provides a voltage to the N-wells of p-channel FETs 214, 215 and 221 which is approximately equal to the $V_{cc}$ supply voltage, thereby preventing turn-on of the corresponding parasitic bipolar transistors and latch-up.

Turning now to the operation of word line control circuit 201, when the address signals applied to input terminals 211a–211c are logic high voltages, transistors 212a–212c are turned on. As a result, the gates of transistors 221 and 222 of word line driver circuit 220 are connected to the ground supply terminal, thereby turning on p-channel transistor 221 and turning off n-channel transistor 222. Consequently, word line 212 is pulled up to the word line boost voltage $V_{CCB}$ provided by $V_{CCB}$ voltage generator 300 on supply line 307. Because the N-wells of p-channel FETs 214, 215 and 221 are coupled to $V_{CCB}$ generator 300, the parasitic bipolar transistors formed by these FETs are not turned on.

As described in more detail below, $V_{CCB}$ voltage generator 300 generates a substantially constant, regulated voltage which is approximately equal to the $V_{cc}$ supply voltage plus the threshold voltage $V_T$ of the pass transistors in DRAM array 200. In a particular embodiment, the $V_{cc}$ supply voltage is 5 volts, and the word line boost voltage $V_{CCB}$ is approximately 6.5 volts.

Figure 3:
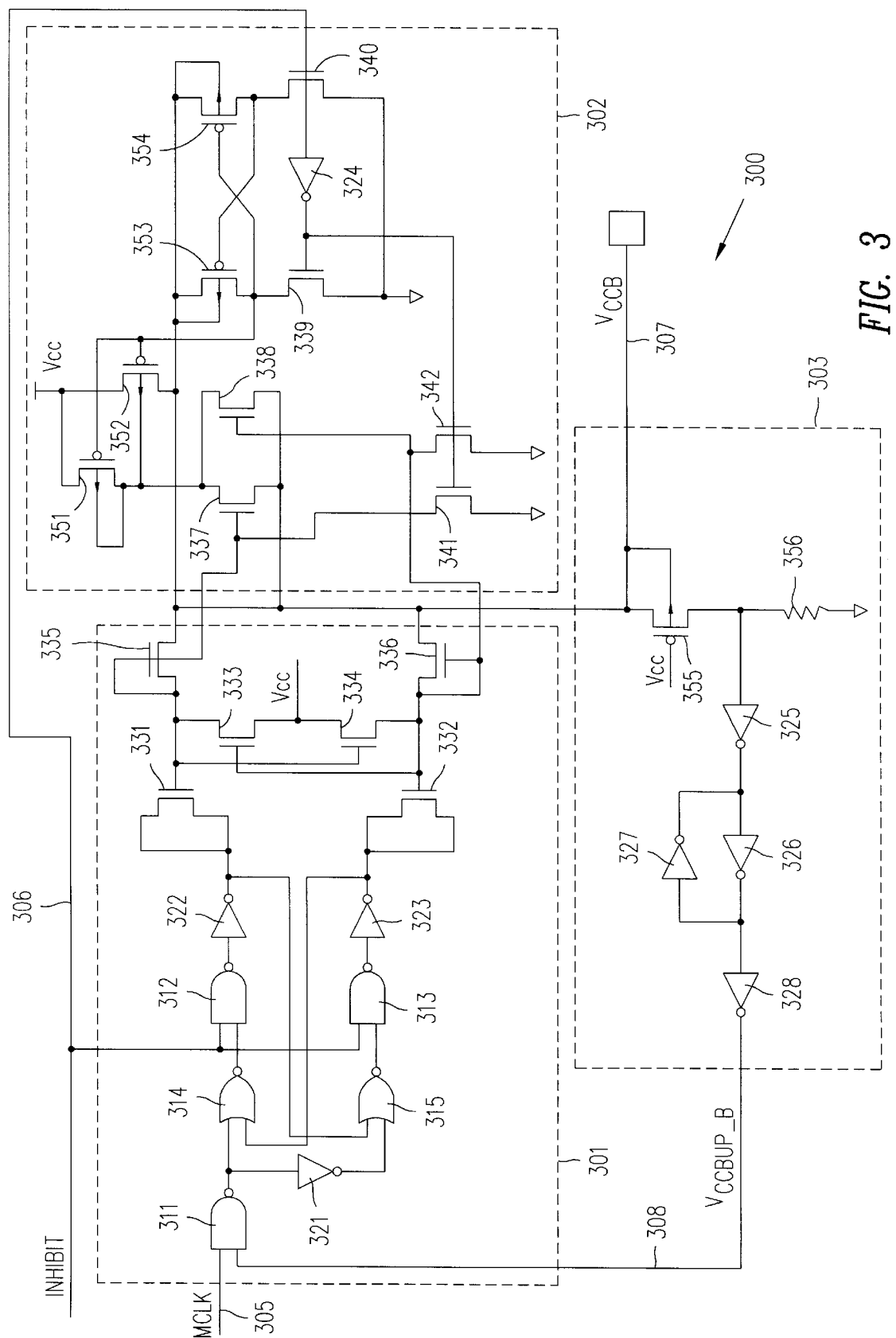
FIG. 3 is a schematic diagram of a word line boost voltage generator in accordance with one embodiment of the invention.

FIG. 3 is a schematic diagram of word line boost voltage $V_{CCB}$ generator 300. $V_{CCB}$ voltage generator 300 includes charge pump circuit 301, latch-up prevention circuit 302 and voltage regulator circuit 303. Charge pump circuit 301 includes NAND gates 311–313, NOR gates 314–315, inverters 321–323 and n-channel FETs 331–336. Latch-up prevention circuit 302 includes inverter 324, n-channel FETs 337–342 and p-channel FETs 351–354. Voltage regulator circuit 303 includes p-channel FET 355, resistor 356, and inverters 325–328. A master clock (MCLK) signal is provided to charge pump circuit 301 on lead 305 and an INHIBIT signal is provided to charge pump circuit 301 and latch-up prevention circuit 302 on lead 306. In a particular embodiment, both the MCLK signal and the INHIBIT signal are provided by an external device. Boosted voltage $V_{CCB}$ is provided from voltage regulator circuit 303 to word line driver circuit 220 (FIG. 2) on supply line 307. Voltage regulator circuit 303 provides a boost voltage control signal ($V_{CCBUP}$) from regulator circuit 303 to charge pump circuit 301 on lead 308.

Charge pump circuit 301 is a two-phase charge pump which alternately charges and discharges a pair of capacitors. The two-phase nature of charge pump circuit 301 reduces voltage ripple at supply line 307. The capacitors of charge pump circuit 303 are formed by n-channel FETs 331 and 332. As described in more detail below, capacitors 331 and 332 are charged from transistors 334 and 333, respectively.

During normal operation of $V_{CCB}$ generator 300, both the INHIBIT signal and the regulator control signal $V_{CCBUP}$ are at a logic high level. Under these conditions, the operation of charge pump circuit 301 is controlled by the MCLK signal. In a particular embodiment, the MCLK signal is used by other on-chip circuitry to synchronize the reading and writing of data values within DRAM array 200. When the MCLK signal is at a logic high level, NAND gates 311–313, NOR gates 314–315 and inverters 321–323 operate to provide a logic low signal at the output terminal of inverter 323 and a logic high signal at the output terminal of inverter 322. Capacitor 331 couples the logic high output signal from inverter 322 to the gate of n-channel FET 334, thereby turning on FET 334. When turned on, FET 344 couples the $V_{cc}$ voltage supply to capacitor 332. As a result, capacitor 332 is charged at a potential equal to $V_{cc}$.

When the MCLK signal is low (i.e., during the next half cycle of the MCLK signal), inverter 322 provides an output signal having a logic low level and inverter 332 provides an output signal having a logic high level. As a result, capacitor 332 provides an output voltage equal to two times the $V_{cc}$ supply voltage. The voltage provided by capacitor 332 turns on n-channel transistor 333, thereby causing capacitor 331 be coupled to the $V_{cc}$ voltage supply and charge at a voltage equal to the $V_{cc}$ supply voltage. The voltage provided by capacitor 332 also turns on diode-connected transistor 336. Consequently, the charge stored in capacitor 332 is discharged through transistor 336 to supply line 307, thereby causing the boost voltage $V_{CCB}$ to rise.

When the MCLK signal transitions back to a logic high level, capacitor 331 is discharged to $V_{CCB}$ voltage supply line 307 through diode connected transistor 335 in the manner previously described for capacitor 332. Also during this time, capacitor 332 is re-charged. In this manner, the $V_{CCB}$ voltage is pumped during both the negative and positive phases of the MCLK signal.

Turning now to voltage regulator circuit 303, the gate of p-channel FET 355 is coupled to receive the $V_{cc}$ supply voltage. When the $V_{CCB}$ voltage on supply line 307 exceeds the $V_{cc}$ voltage by the threshold voltage of transistor 355 ($V_{TP}$), transistor 355 turns on, thereby causing a voltage to appear across resistor 356. As $V_{CCB}$ continues to rise, the voltage across resistor 356 will rise until the logic threshold of inverter 325 is exceeded. At this time, inverter 325 provides a logic low output signal. As a result, the output of inverter 328 (i.e., regulator control signal $V_{CCBUP}$) also goes low, thereby disabling charge pump circuit 301. Inverters 326 and 327 form a Schmidt trigger gate which suppresses signal ring at the output of inverter 325. Feedback inverter 327 introduces hysteresis to the input threshold of inverter 326, thereby improving the noise immunity of voltage regulator circuit 303.

Transistor 355 and resistor 356 are sized such that charge pump circuit 301 is disabled when the voltage on supply line 307 exceeds the desired $V_{CCB}$ voltage (e.g., 6.5 volts). When charge pump circuit 301 is disabled, the $V_{CCB}$ voltage stops rising. Activation of word line 212 (FIG. 2) drains current from charge pump circuit 301 and causes the $V_{CCB}$ voltage on supply line 307 to drop. When the voltage on supply line 307 drops drops below the desired $V_{CCB}$ supply voltage, transistor 355 is turned off, thereby causing a logic low input signal to be applied to the input terminal of inverter 325. As a result, the output of inverter 328 transitions to a logic high state to enable current pump circuit 301. The $V_{CCB}$ voltage is thus regulated to approximately 1.5 volts above the $V_{cc}$ supply voltage.

Latch-up prevention circuit 302 couples supply line 307 to the $V_{cc}$ voltage supply during power-on, thereby applying the $V_{cc}$ supply voltage to line 307 during power-on of the memory system. Latch-up prevention circuit 302 allows the $V_{CCB}$ voltage on supply line 307 to rise above the $V_{cc}$ supply voltage after power-on. By maintaining the voltage on supply line 307 close to the $V_{cc}$ supply voltage during power-on, the parasitic bipolar transistors associated with p-channel FETs 214, 215 and 221 (FIG. 2) are prevented from turning on. This is because the voltage on supply line 307 is provided to the N-well(s) of FETs 214, 215 and 221. As a result, latch-up is prevented during power-on.

Latch-up prevention circuit 302 is controlled by the INHIBIT signal. During power-on, the INHIBIT signal is asserted low, thereby enabling latch-up prevention circuit 302 and disabling charge pump circuit 301. The low INHIBIT signal causes the output signal of inverter 324 to transition to a logic high level and turns on n-channel transistor 339. Turned-on transistor 339 couples the gates of p-channel transistors 351 and 352 to the ground voltage supply, thereby turning on these transistors 351–352. The logic high output signal of inverter 324 also turns on n-channel transistors 341 and 342, which in turn, cause n-channel transistors 337 and 338 to turn off.

As a result, the N-wells of transistors 351 and 352 are isolated from supply line 307. Turned-on transistor 352 connects the $V_{cc}$ voltage supply to supply line 307. The channel of transistor 352 is made wide enough to allow the voltage on supply line 307 to remain close to the $V_{cc}$ supply voltage for the normal ramp rate of the $V_{cc}$ supply voltage during power-on.

Transistors 351 and 352 share the same N-well. During power-on, turned-on transistor 351 maintains the voltage of this shared N-well near the $V_{cc}$ supply voltage. Since the junction capacitance of the shared N-well is relatively small compared to the capacitance of supply line 307, the shared N-well potential is kept close to the $V_{cc}$ supply voltage by transistor 351. As a result, the parasitic bipolar transistor formed by this shared N-well is prevented from turning on.

After power-on, the INHIBIT signal is de-asserted high, thereby turning off transistors 351 and 352 and enabling charge pump circuit 301. When capacitor 331 of charge pump circuit 301 is being discharged, the voltage applied to the gate of n-channel transistor 337 of latch-up prevention circuit 302 is greater than the $V_{cc}$ supply voltage plus the threshold voltage $V_{TN}$ of transistor 337, thereby causing transistor 337 to operate in the triode (or linear) region. Similarly, when capacitor 332 of charge pump circuit 301 is being discharged, the voltage applied to the gate of n-channel transistor 338 of latch-up prevention circuit 302 is greater than the $V_{cc}$ supply voltage plus the threshold voltage $V_{TN}$ of transistor 338, thereby causing transistor 338 to operate in the triode region. As a result, the shared N-well of transistors 351 and 352 is coupled to $V_{CCB}$ voltage supply line 307 by transistors 337 and 338 during normal operation. Thus, the shared N-well of transistors 351 and 352 is maintained at a voltage close to the $V_{CCB}$ voltage on supply line 307, preventing latch-up which could be caused by turning on the parasitic bipolar transistor formed by this shared N-well.

Figure 4:
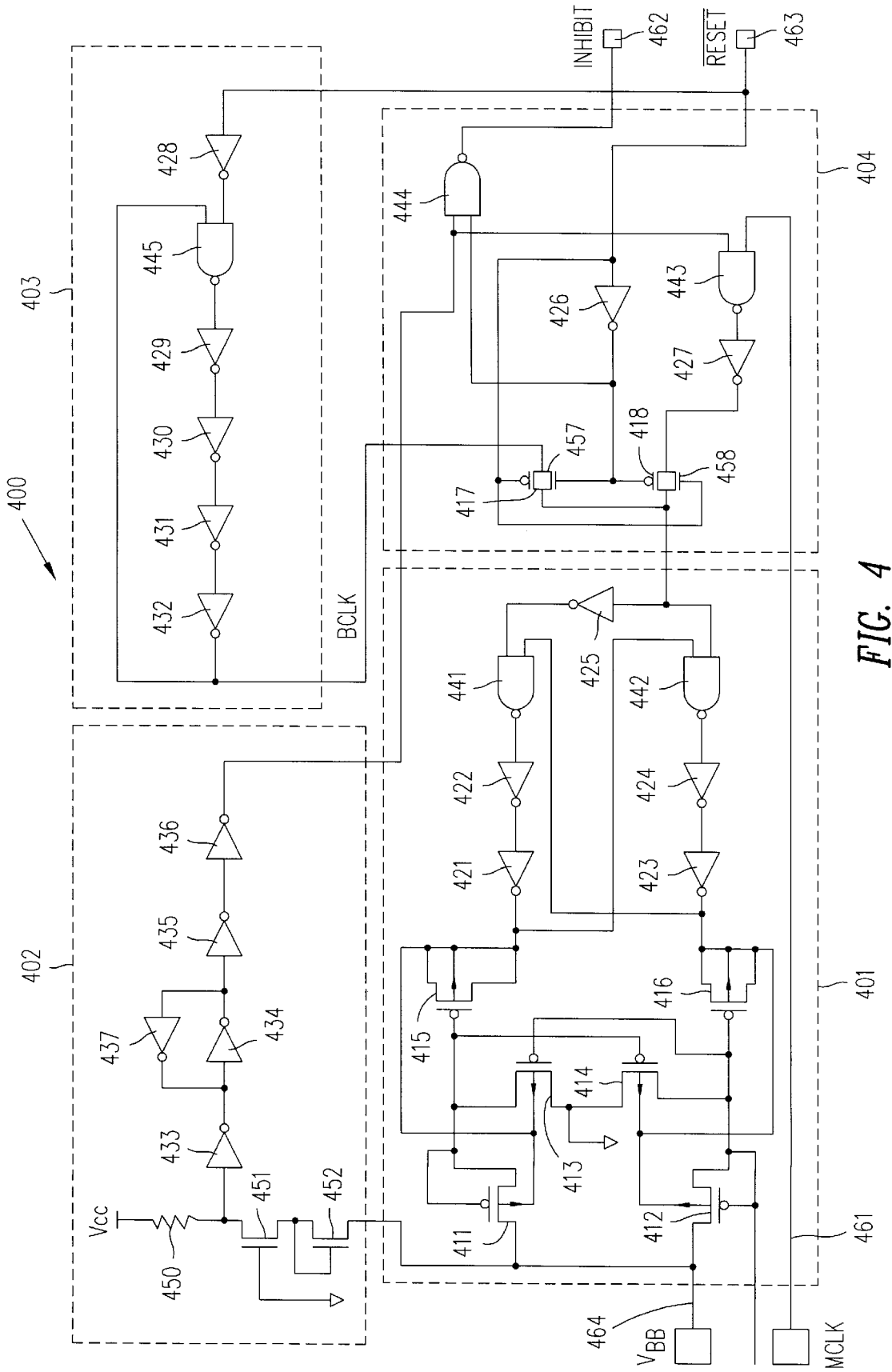
FIG. 4 is a schematic diagram of substrate bias generator in accordance with one embodiment of the invention.

FIG. 4 is a schematic diagram of substrate bias generator 400 in accordance with one embodiment of the invention. Substrate bias generator 400, which generates a bias voltage ($V_{BB}$) which is applied to the bulk of the n-channel transistors in the above described memory system, includes charge pump circuit 401, voltage regulator circuit 402, ring oscillator circuit 403 and clock source selector circuit 404.

Charge pump circuit 401 includes p-channel FETs 411–416, inverters 421–425 and NAND gates 441–442. Voltage regulator circuit 402 includes inverters 433–437, resistor 450 and n-channel FETs 451–452. Ring oscillator circuit 403 includes inverters 428–432 and NAND gate 445. Clock source selector circuit 404 includes p-channel pass transistors 417–418, n-channel pass transistors 457–458, inverters 426–427 and NAND gates 443–444. These elements are connected as illustrated in FIG. 4.

Charge pump circuit 401 generates a negative substrate bias voltage $V_{BB}$ on supply line 464 in response to a clock signal received from clock selector circuit 404. As described in more detail below, during normal operating conditions, clock selector circuit 404 provides the MCLK signal to charge pump circuit 401, while during power-on, clock selector circuit 404 provides a BCLK signal from ring oscillator circuit 403 to charge pump circuit 401.

The clock signal received by charge pump circuit 401 is applied to the circuit formed by inverters 421–425 and cross-coupled NAND gates 441–442, thereby alternately charging the capacitors formed by p-channel transistors 415–416. P-channel transistors 411–414 alternately switch the charge stored in capacitors 415 and 416 to supply line 464 to generate the $V_{BB}$ voltage. Because switching transistors 413 and 414 are connected to the ground voltage supply, negative charge is pumped from capacitors 415 and 416 to supply line 464. Consequently, the $V_{BB}$ bias voltage built up on supply line 464 is a negative voltage.

Ring oscillator circuit 403 generates a clock signal (BCLK) for driving the charge pump circuit 401 during power-on. To activate ring oscillator circuit 403, a logic low $\overline{\text{RESET}}$ signal is asserted on input lead 463. The $\overline{\text{RESET}}$ signal can be generated by an on-chip or an external power-on reset circuit. The frequency of the BCLK signal generated by ring oscillator circuit 403 is selected by engineering the characteristics of inverters 428–432 and NAND gate 445. In one embodiment, these elements are designed to produce a BCLK signal having a frequency of approximately 5 Mhz.

Clock selector circuit 404 is connected to receive both the MCLK and BCLK signals. Clock selector circuit 404 determines which of these two clock signals is provided to charge pump generator circuit 401. When the $\overline{\text{RESET}}$ signal is asserted low during power-on, pass transistors 417 and 457 are turned on, thereby passing the BCLK signal from ring oscillator circuit 403 to charge pump generator circuit 401. During the initial stage of the power-on period, the $V_{BB}$ bias voltage has not yet reached its target voltage. As described in more detail below, during these conditions, inverter 436 of regulator circuit 402 provides a logic high signal which causes the output of NAND gate 444 (i.e., the INHIBIT signal) to be in a logic low state. As previously described, the logic low INHIBIT signal disables the charge pump circuit 301 and enables the latch-up prevention circuit 302 of $V_{CCB}$ voltage generator 300 (FIG. 3).

After the predetermined power-on period has expired (after approximately 1 to 4 micro-seconds), the $\overline{\text{RESET}}$ signal is de-asserted high. The high $\overline{\text{RESET}}$ signal causes pass transistors 417 and 457 to turn off and pass transistors 418 and 458 to turn on. Under these conditions, the MCLK signal is capable of being transmitted through pass transistors 418 and 458 to charge pump circuit 401. Note that the MCLK signal will only be transmitted in this manner when a logic high signal is provided to NAND gate 443 from inverter 436 of regulator circuit 402. The operation of regulator circuit 402 is described in more detail below.

Another result of the logic high $\overline{\text{RESET}}$ signal is that ring oscillator circuit 403 is disabled, thereby preventing ring oscillator circuit 403 from generating a clock signal which could interfere with other on-chip circuits during normal operation of the memory system. In a particular embodiment, the MCLK signal is a signal which is synchronized with an external clock signal using a conventional phase locked loop circuit with a voltage controlled oscillator. In such an embodiment, disabling ring oscillator circuit 403 after power-on prevents the BCLK signal from interfering with the voltage controlled oscillator during normal operation of the memory system.

Yet another result of the logic high $\overline{\text{RESET}}$ signal is that the INHIBIT signal is automatically de-asserted high when the $V_{BB}$ bias voltage reaches its desired level during the power-on reset period.

The operation of voltage regulator circuit 402 will now be described. Voltage regulator circuit 402 includes two n-channel transistors 451–452 which are coupled to receive the $V_{BB}$ bias voltage on supply line 464. Each of these transistors 451–452 has a negative threshold voltage $V_{TN}$ of approximately 0.075 volts. When the $V_{BB}$ bias voltage on supply line 464 becomes more negative than $-2 \times V_{TN}$ (or approximately -1.5 volts), transistors 451 and 452 are turned on. Consequently, a logic low signal is applied to inverter 433. This logic low signal is propagated through inverters 433–436 to provide a logic low signal at the output terminal of inverter 436. Inverters 434 and 437 form a Schmidt trigger to suppress signal ringing at the output of inverter 436. The logic low signal provided by inverter 436 is applied to an input terminal of NAND gate 443 in clock selector circuit 404. In response, NAND gate 443 transmits a logic high signal, thereby effectively disabling the MCLK signal and preventing charge pump circuit 301 from being pumped.

When the $V_{BB}$ bias voltage becomes more positive than $-2 \times V_{TN}$, transistors 451 and 452 are turned off, thereby causing the output signal of inverter 436 to go high. As a result, charge pump circuit 401 is enabled. By enabling and disabling charge pump circuit 401, voltage regulator circuit 402 maintains a $V_{BB}$ bias voltage of approximately $-2 \times V_{TN}$ on supply line 464.

Synchronization of charge pump circuits 301 and 401 with the MCLK signal advantageously provides charge pump circuits 301 and 401 with an output current capability which varies proportionally with the output current requirements of charge pump circuits 301 and 401. The output current requirements of charge pump circuits 301 and 401 are directly proportional to the operating frequency of the on-chip circuits. Thus, as the operating frequency of the on-chip circuits increases, the current which must be provided by charge pump circuits 301 and 401 also increases. However, the output current capabilities of charge pump circuits 301 and 401 are also directly proportional to the operating frequency of the on-chip circuits. That is, as the operating frequency of the on-chip circuits increases, the current which can be provided by charge pump circuits 301 and 401 also increases. The increased current output capabilities of charge pump circuits 301 and 401 at high frequencies prevents overloads on voltage generator circuits 300 and 400 during high frequency operation of the memory system.

Since the $V_{CCB}$ charge pump circuit 301, the $V_{BB}$ charge pump circuit 401, and any on-chip PLL circuit are all synchronous with respect to the MCLK signal, frequency interference between these circuits is advantageously minimized.

Although the invention has been described in connection with several embodiments, it is understood that this invention is not limited to the embodiments disclosed, but is capable of various modifications which would be apparent to one of ordinary skill in the art. For example, although the described embodiments included a memory system formed on a p-type substrate and having memory cells with NMOS pass transistors, the present invention can be modified for operation in a memory system formed on an n-type substrate and having memory cells with PMOS pass transistors. In such a modification, the $V_{CCB}$ word line boost voltage would be negative with respect to the ground supply voltage (e.g., approximately −1.5 volts), and the $V_{BB}$ substrate bias voltage would be more positive than the $V_{cc}$ supply voltage (e.g., approximately 6.5 volts). Thus, the invention is limited only by the following claims.

What is claimed is:

1. A voltage generator which generates a bias voltage for biasing a substrate of a semiconductor circuit, the voltage generator comprising:

a voltage generation circuit which generates the bias voltage in response to a clock signal;

a ring oscillator for generating a start-up clock signal; and a clock selector circuit for selectively applying the start-up clock signal to the voltage generation circuit during a power-on period and for applying a master clock signal to the voltage generation circuit after the power-on period.

2. The voltage generator of claim 1, further comprising means for disabling the ring oscillator circuit from generating the start-up clock signal after the power-on period.

3. A method of biasing a substrate of a semiconductor circuit, the method comprising the steps of:

generating a start-up clock signal by a ring oscillator circuit;

generating a bias voltage in response to the start-up clock signal;

applying the bias voltage generated in response to the start-up clock signal to the substrate during a power-on period;

generating a bias voltage in response to a master clock signal; and applying the bias voltage generated in response to the master clock signal to the substrate after the power-on period.

4. The method of claim 3, further comprising the step of disabling the ring oscillator circuit from generating the start-up clock signal after the power-on period.

\* \* \* \* \*